United States Patent
Rivers et al.

(10) Patent No.: US 6,587,936 B1
(45) Date of Patent: Jul. 1, 2003

(54) MULTI-BANK MEMORY ACCESS METHOD AND APPARATUS

(75) Inventors: James P. Rivers, Saratoga, CA (US); Scott A. Emery, Saratoga, CA (US)

(73) Assignee: Cisco Technology, Inc., San Jose, CA (US)

( * ) Notice: Subject to any disclaimer, the term of this patent is extended or adjusted under 35 U.S.C. 154(b) by 143 days.

(21) Appl. No.: 09/790,295

(22) Filed: Feb. 21, 2001

(51) Int. Cl.$^7$ .......................... G06F 12/02; G06F 12/08
(52) U.S. Cl. ........................ 711/170; 711/171; 711/172
(58) Field of Search ................. 711/170, 171, 711/172, 201

(56) References Cited

U.S. PATENT DOCUMENTS

| | | | |
|---|---|---|---|
| 4,281,398 A | 7/1981 | McKenny et al. | 365/200 |
| 4,831,594 A | 5/1989 | Khosrovi et al. | 365/222 |
| 4,893,278 A | 1/1990 | Ito | 365/203 |
| 5,265,236 A | 11/1993 | Mehring et al. | 365/425 |
| 5,291,443 A | 3/1994 | Lim | 365/189.04 |
| 5,305,280 A | 4/1994 | Hayano | 365/230.03 |
| 5,406,526 A | 4/1995 | Sugibayashi et al. | 365/230.03 |
| 5,588,130 A | 12/1996 | Fujishima et al. | 395/445 |
| 5,619,473 A | 4/1997 | Hotta | 365/238.5 |
| 5,619,500 A | 4/1997 | Hiekali | 370/414 |
| 5,623,635 A | 4/1997 | Chen et al. | 395/479 |
| 5,634,046 A | 5/1997 | Chatterjee et al. | 395/568 |
| 5,640,597 A | 6/1997 | Noguchi et al. | 395/841 |
| 5,650,972 A | 7/1997 | Tomishima et al. | 365/207 |
| 5,680,570 A | 10/1997 | Rantala et al. | 395/440 |
| 5,748,633 A | 5/1998 | Lawler et al. | 370/401 |
| 5,787,255 A | 7/1998 | Parlan et al. | 395/200.63 |
| 5,802,002 A | 9/1998 | Ienaga | 365/207 |
| 5,805,590 A | 9/1998 | Gillard et al. | 370/395 |
| 5,841,580 A | 11/1998 | Farmwald et al. | 365/194 |
| 5,991,851 A | 11/1999 | Alwais et al. | 711/106 |
| 6,002,623 A | 12/1999 | Stave et al. | 365/201 |
| 6,078,532 A | 6/2000 | Rivers et al. | 365/194 |
| 6,201,729 B1 | 3/2001 | Rivers | 365/149 |
| 6,282,706 B1 * | 8/2001 | Chauvel et al. | 717/150 |

OTHER PUBLICATIONS

"16Mbit Enhanced SDRAM Family 4Mx4, 2Mx8 1Mx16 Preliminary", copyright 1998, Enhanced Memory Systems Inc, pp. 1–9.

"FM1608 64Kb Bytewide FRAM Memory", Jan. 6, 1999, Ramtron International Corporation, pp. 1–12.

* cited by examiner

*Primary Examiner*—Reginald G. Bragdon
*Assistant Examiner*—Midys Inoa
(74) *Attorney, Agent, or Firm*—Hickman Palermo Troung & Becker LLP (57) ABSTRACT

Data is stored in a memory in a manner which eliminates dead time which occurs when the number of words in a page which are read-out are insufficient to provide enough time for simultaneously opening the next page. If the length of a frame being stored in memory is not an exact integral multiple of words in a page, a penultimate (or earlier) page is written with fewer words than the page can hold. This allows additional words to be placed into the last page, sufficient to provide every page used for storing a frame at least a number of words equal to the number of clock cycles needed for opening a next page.

19 Claims, 4 Drawing Sheets

MULTI-BANK MEMORY ACCESS METHOD AND APPARATUS

The present invention is related to a method and apparatus for accessing a multi-bank memory and in particular to a method and apparatus which can increase effective bandwidth of such access.

BACKGROUND INFORMATION

A number of techniques have been used or proposed in connection with multi-bank memory systems for providing high bandwidth access. In one technique, if there are, e.g., two banks, it can be advantageous to configure the system such that while a row or page of data is being read-out from one of the banks, a page-opening procedure (for the data which is to be readout from the next bank) is being performed on the second bank. Ideally, by the time data readout from the first bank is complete, the second bank has completed its page-opening procedures and data-readout from the second bank can begin immediately (i.e., in the next clock cycle, following the clock cycle in which the last data was read-out from the first bank). Such techniques can be especially useful when multiple rows or pages of data are commonly read-out from alternative banks. One example of the situation is when a multi-bank memory is used for first-in-first-out (FIFO) storage or buffering of data packets or frames in a network or telecommunication system. It is common, in these situations, for the frame length to exceed a single page width and accordingly, it is common for data to be stored into, and read-out from, pages of alternating banks of the memory.

In an ideal situation, if the "effective bandwidth" is expressed as the number of words read-out from the memory (over an extended period of time) divided by the number of clock cycles occupied by such read-out, in an ideal situation, the bandwidth would be 1.0. In other words, in an ideal situation, one word is read-out for every clock cycle, over an extended period of time. In practice, it has been found that the effective bandwidth for multi-bank memories is typically somewhat less than ideal. Accordingly, it would be useful to provide a system method and apparatus which can increase the effective bandwidth of a multi-bank memory system.

SUMMARY OF THE INVENTION

The present invention includes a recognition of the existence, nature, significance and/or consequences of problems in previous approaches, including as described herein. When frames or other blocks of data are stored into pages of memory, situations may arise in which the number of words in the frame is not an integral multiple of the number of words in a page. Accordingly, the last page in the memory used for storing the last portion of the frame may be less than full. As one (simplified) example, if a fame contains 25 words and a page has a width of 8 words, the frame can be stored in 4 pages (3 pages of 8 words each and a final page containing a single word). As described above, in at least some systems, while data is being read-out from a page in a first bank of memory, page-opening procedures are being performed in the second bank, for the next page which is to be read-out. In the present example, if page-opening procedures require two (or more) clock cycles, there will be insufficient time to complete page-opening procedures (for the next bank) during the time that the single word stored in the last page (for the 25-word frame) is performed. If only one clock cycle is needed for reading out the single word from the last page of the 25-word frame, two-clock-cycle page-opening procedures for opening the first page of whatever data is to be read-out next (i.e., after the 25 word frame has been read-out) will not be complete and there will be at least one clock cycle (referred to as "dead time") during which no data is read-out (i.e., the second clock cycle required to complete page-opening procedures for the next read-out). Any occurrence of such "dead time" cycles will reduce the long-term effective bandwidth to a less-than-ideal value.

According to one embodiment of the invention, data is stored into pages of memory in a multi-bank memory in such a way as to avoid such dead time during subsequent read-out. According to one embodiment, when it is determined that storage of a block of data in the traditional manner will result in a page which stores a number of words, in one of the pages, which is smaller than the number of clock cycles required to open a page, the words of the frame or block will instead be stored in a non-traditional manner so as to increase the number of words in the last page or pages, preferably such that all pages used for storing the frame have a number of words equal to or greater than the number of clock cycles required for page-opening processes. As one example, if 8-word pages are to be used for storing a 25-word frame, and if page-opening requires two clock cycles, then the 25 words can be stored in a total of 4 pages: 2 pages storing 8 words each, 1 page storing 7 words and a final page storing 2 words. Since the final page, in this example, stores 2 words, it is possible to complete page-opening processes for whichever page is to be read-out after the 25 page frame, during the time that the 2 words in the final page are read-out.

For purposes of explanation, the process of reducing the number of words stored in one page so that the number of words stored in a different page can be increased, is referred to herein as "borrowing" one or more words from the page in which the number of words is decreased.

At least some aspects of the present invention can be advantageously used regardless of the number of words in a page or the number of clock cycles needed for page-opening (if, in a two-bank example, the number of the required clock cycles does not exceed the number of words in a page). In general, the present invention is capable of eliminating all dead time caused by pages with fewer words than the number of cycles needed for page-opening if the number of "extra" words in a frame in excess of a multiple of the word width (i.e., the frame length modulo the page width) plus the page width is greater than or equal to twice the number of clock cycles required for page-opening.

In one aspect, data is stored in a memory in a manner which eliminates dead time which occurs when the number of words in a page which are read-out are insufficient to provide enough time for simultaneously opening the next page. If the length of a frame being stored in memory is not an exact integral multiple of words in a page, a penultimate (or earlier) page is written with fewer words than the page can hold. This allows additional words to be placed into the last page, sufficient to provide every page used for storing a frame at least a number of words equal to the number of clock cycles needed for opening a next page.

DETAILED DESCRIPTION OF THE PREFERRED EMBODIMENTS

For convenience of discussion, in the following:

P designates the page width in a multiple bank memory (i.e., the number of words in a page);

L' designates the length (i.e., the number of words) of a frame (or similar block of data);

Q designates the number of clock cycles required for page-opening procedures;

L designates the number of words remaining, in a frame or block, yet to be written to memory; and E designates the number of extra words beyond the next smaller multiple of P, and in general is equal to L' MOD P. For example, if P is 8, for L=24, E=0 (i.e., the frame length is an exact integral multiple of the page width so there are no extra words). For L'=25, E=1 (i.e., the number of words in the frame is an integral multiple, in this case, 3, of P, plus 1 extra word) and so forth.

Figure 2A:
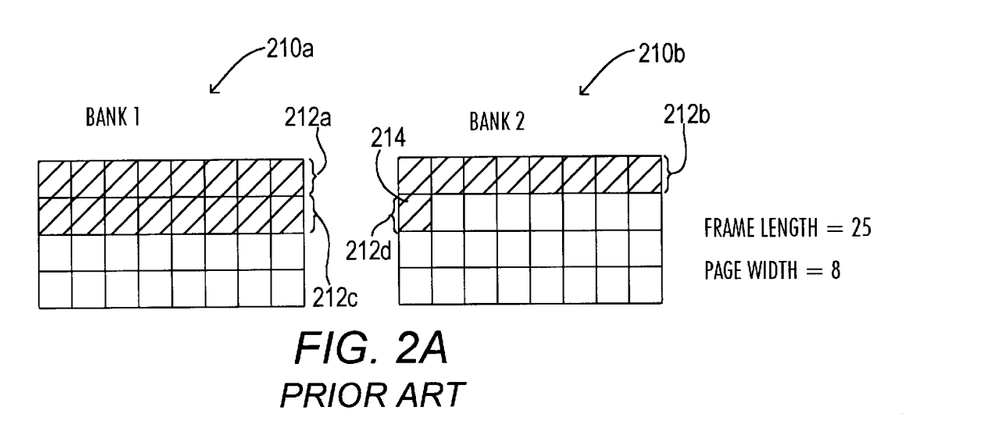
FIG. 2A is a block diagram depicting word storage in two banks of a memory according to previous approaches.
Figure 2B:
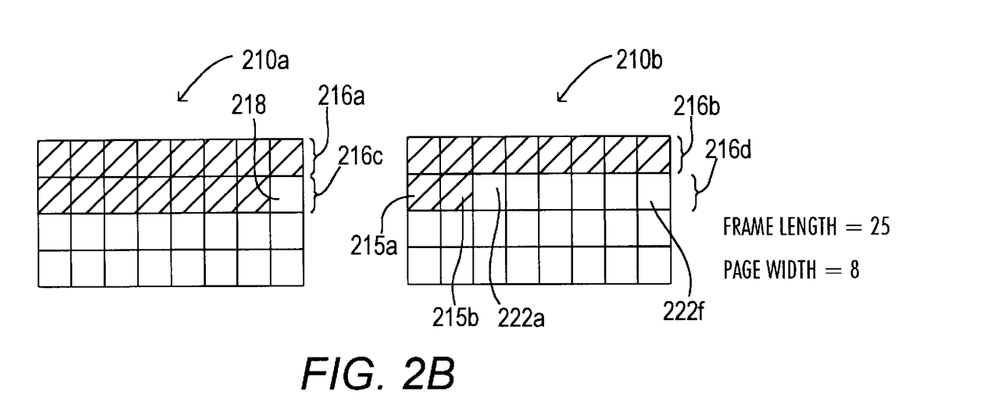
FIG. 2B is a block diagram depicting word storage in two banks of a memory according to an embodiment of the present invention.

FIG. 2A illustrates, in schematic block diagram fashion, one manner of storing a 25-word frame in first and second banks of a memory having an 8-word page width, according to previous approaches. In FIGS. 2A and 2B, each square represents a word, each row represents a page and cross-hatching represents memory words which are used to store words from the frame. In typical previous approaches, a frame was stored in pages of (alternating) banks of a memory by completely filling each page when possible, with any extra words (as defined above) being stored in a portion of the last page. For example, in FIG. 2A, the first 8 words of the 25-word frame is stored in a first page 212a in a first bank of memory, the next 8 words are stored in a page 212b of the second bank of memory, the next 8 words are stored in a page 212c of the first bank of memory and the final word is stored in a page 212d of the second bank of memory. Thus, the situation illustrated in FIG. 2A is an example of a situation in which, if page-opening for the memory requires two or more clock cycles, the last page 212d used for storing the frame has fewer words than the number of cycles required for page opening (i.e., the last page 212d contains one word while the number of clock cycles required for page-opening is 2, (i.e., E=1 and Q=2).

Figure 1A:
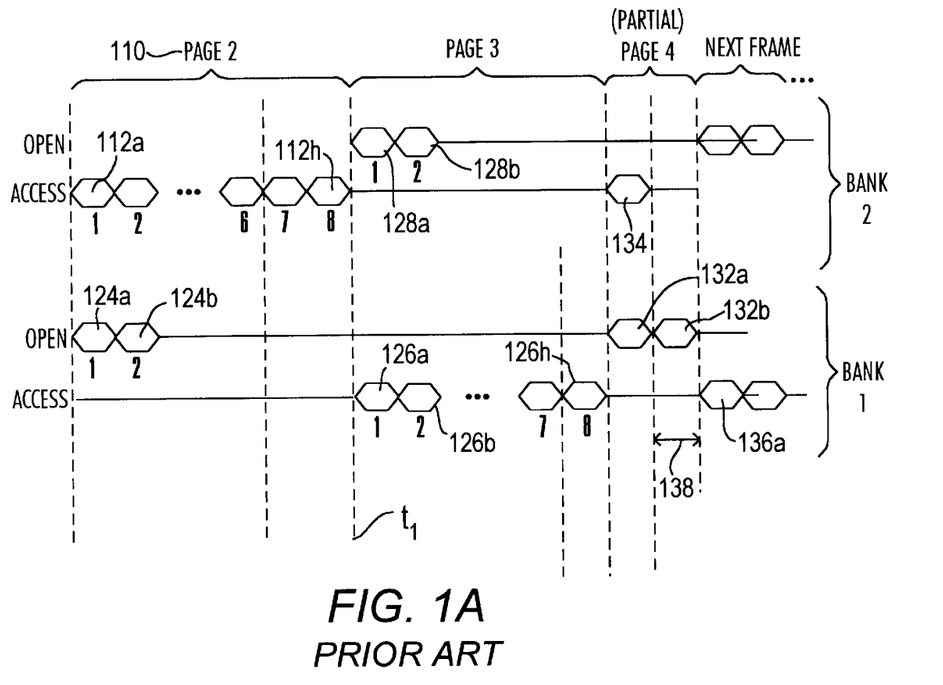
FIG. 1A is a timing diagram depicting an example of timing according to traditional approaches which results in a clock cycle of dead time.

FIG. 1A illustrates the manner in which the storage scheme illustrated in FIG. 2A can lead to dead time when the data is read-out from the memory. In previous or traditional approaches, when frame data is stored according to the example of FIG. 2A, upon reading-out the stored data, the pages are read-out in the same order that they were stored. While data from a given page is being read-out, the page-opening procedures are being performed on the other bank of memory, for that page which will be next read-out. Thus, in the illustration of FIG. 1A, during the time 110 that the 8 words 112a through 112h (of the second page 212b) are being read-out, a page-opening procedure is being performed during two clock cycles 124a, 124b on bank number one (with respect to the third page 212c). As illustrated in FIG. 1A, by the time T1 that the second page 212b is read-out, the page-opening procedures for the next page 212c have been completed, and read-out of the 8 words 126a through 126h from the third page 212c can be performed. As seen in FIG. 1A, the read-out of the first word 226a from the third page 216c occurs in the clock cycle immediately following the clock cycle in which the last word 112h of the second page 212b was read-out.

As before, page-opening procedures are performed on the fourth page 212d (in the second bank 210b) during first two clock cycles 128a,b corresponding to the clock cycles in which the first two words 126a, 126b are read-out from the third page 212c. Accordingly, by the time the last word 126h is read-out from the third page 212c, the fourth page 212d is open and data can be read-out from the fourth page 212d immediately after (i.e. in the next clock cycle after) the last word 126h is read-out from the third page 212c.

In many situations, and commonly when using a memory for frame buffering and the like, it is desired that, upon completion of reading-out all the data from a frame, read-out of data from the next frame should commence immediately (i.e., on the next clock cycle). In the illustration of FIG. 1A, simultaneously with commencing read-out of data from the last page 216d of the frame, the system begins page-opening procedures for a page of bank one 210a (whichever page of bank 1 will be the page which stores the initial portion of whatever frame is to be read-out after the current frame). However, as illustrated in FIG. 1A, while the frame opening procedures 132a,b require two clock cycles, there is only one word 214 stored in the fourth page 212d, and this requires only a single clock cycle 234. Accordingly, while the first clock cycle of the page-opening procedure 132a can occur simultaneously with the clock cycle 134 used for read-out of the final word 214 of the frame, there is no word available for read-out during the time that the second clock cycle 132b of the page-opening procedure is performed. (There is no more data to be read-out from the current frame after the last word 214 is read-out during clock cycle 134, and it is not possible to commence read-out of the first portion of the next frame 136 until the page-opening procedures are complete, i.e., until after completion of clock cycle 132b). Accordingly, in the example illustrated in FIGS. 2A and 1A, in previous approaches, there is at least a single "dead time" cycle 138 when a page contains a number of words 214 which is fewer than the number of clock cycles required for page-opening.

FIG. 2B illustrates a manner of storing data which can reduce, and preferably eliminate, dead cycles arising from "extra" words. As depicted in FIG. 2B, in one embodiment, rather than using all 8 words in the penultimate page 216c for storing frame words, a word which would normally (under traditional methods) be stored as the last word 218 of the penultimate page 216c is "borrowed" and placed in the last page 216d (which therefore has two words 215a, 215b). Thus, in the illustrated embodiment, each of the first two pages 216a,b of memory are used to store 8 words from the frame, the third page 216c is used to store 7 words from the frame and the fourth page 216d is used to store the final two words of the frame 215a, 215b. The distribution of words among pages, and subsequent read-out, can be controlled by a memory management unit (MMU).

Figure 1B:
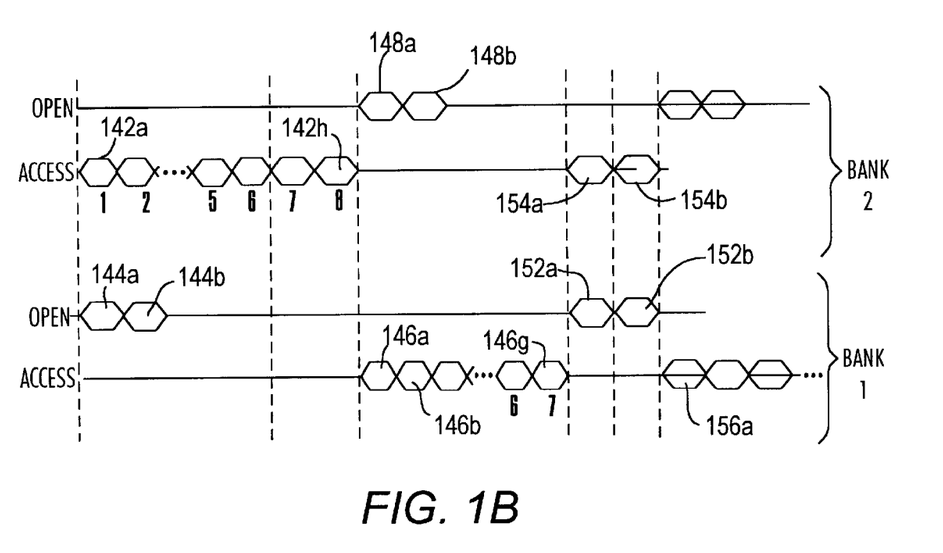
FIG. 1B is a timing diagram similar to FIG. 1A, but using an embodiment of the present invention so as to eliminate dead time.

FIG. 1B illustrates how the storage scheme of the FIG. 2B avoids dead time. In FIG. 1B, read-out of the 8 words 142a through 142b of the second page 216b takes place during 8 clock cycles and, during two of these clock cycles 144a, 144b page-opening procedures are performed on bank number one 210a for opening the third page 216c. As illustrated in FIG. 1B, page-opening of the third page 216c is completed by the time the last word 142h is read-out from the second page 216b and, accordingly, it is possible to immediately (i.e. on the next clock cycle) begin reading-out the first word 146a from the third page 216c. As before, during the first two word accesses or read-outs of the third word 146a, 146b, page-opening procedures are executed 148a,b for opening the fourth page 216d. Because only seven words of the frame are stored in the third page 216c, immediately following read-out of the seventh word 146g, it is possible to begin read-out of the two words 215a,b stored in the fourth page 216d, which thus occupy two clock cycles 154a, 154b. Because the storage scheme illustrated in FIG. 2B provides two words 215a, 215b in the last page 216d, it is possible to execute the two-clock-cycle page-opening procedure 152a,b for opening a page in bank one 210a during the time the last two words of the frame are read-out 154a, 154b from bank two 210b and, accordingly, by the time the last word is read-out 154b, the first page of the next frame is open and the first word of the next frame can immediately (i.e. on the next clock cycle) be read-out 156a. In contrast to FIG. 1A (in which there is at least one clock cycle 138 during which a page-opening procedure 132b is performed while there is no read-out of data, thus representing a dead time), the illustration of FIG. 1B provides for read-out of a frame of the same length, but without any dead time. Specifically, data is read-out during each clock cycle 142a–h, 146a–g, 154a, 154b, 156a . . . Accordingly, in the illustration of FIGS. 2B and 1B, dead time has been avoided.

Although FIGS. 1B and 2B illustrate an example of the invention for particular values of L', P and Q, the present invention can be generalized to any values of L' P and Q, provided, for a 2-bank example, that P is greater than or equal to Q. In order for dead time to be completely eliminated, it is necessary to assure that after borrowing sufficient words from the penultimate page to provide at least Q words in the last page of frame, there must still be at least Q words left in the penultimate page. If the values of P, Q and L' are such that the necessary borrowing would deplete the penultimate page to have fewer than Q words, it would be possible to construct embodiments of the present invention so as to borrow some of the necessary words from other pages (i.e., pages previous to the penultimate page). However, if all words are to be borrowed from the penultimate page, the dead time can only be completely eliminated if the number of words remaining in the penultimate page is greater than or equal to twice Q, i.e., P–(Q–E)≧Q. or P+E≧2Q.

Even if this condition is not fulfilled, such that it is not possible to completely eliminate all dead time, the present invention still provides an advantage compared to traditional methods (or at least provides an effective bandwidth which is no worse than the effective bandwidth of the previous approach). In other words, for a two-bank memory, provided P is greater than Q, the present invention will achieve a bandwidth which is greater than that provided by the above-described traditional approach and, for at least some values of L', will completely eliminate dead time of the type described herein.

Figure 3:
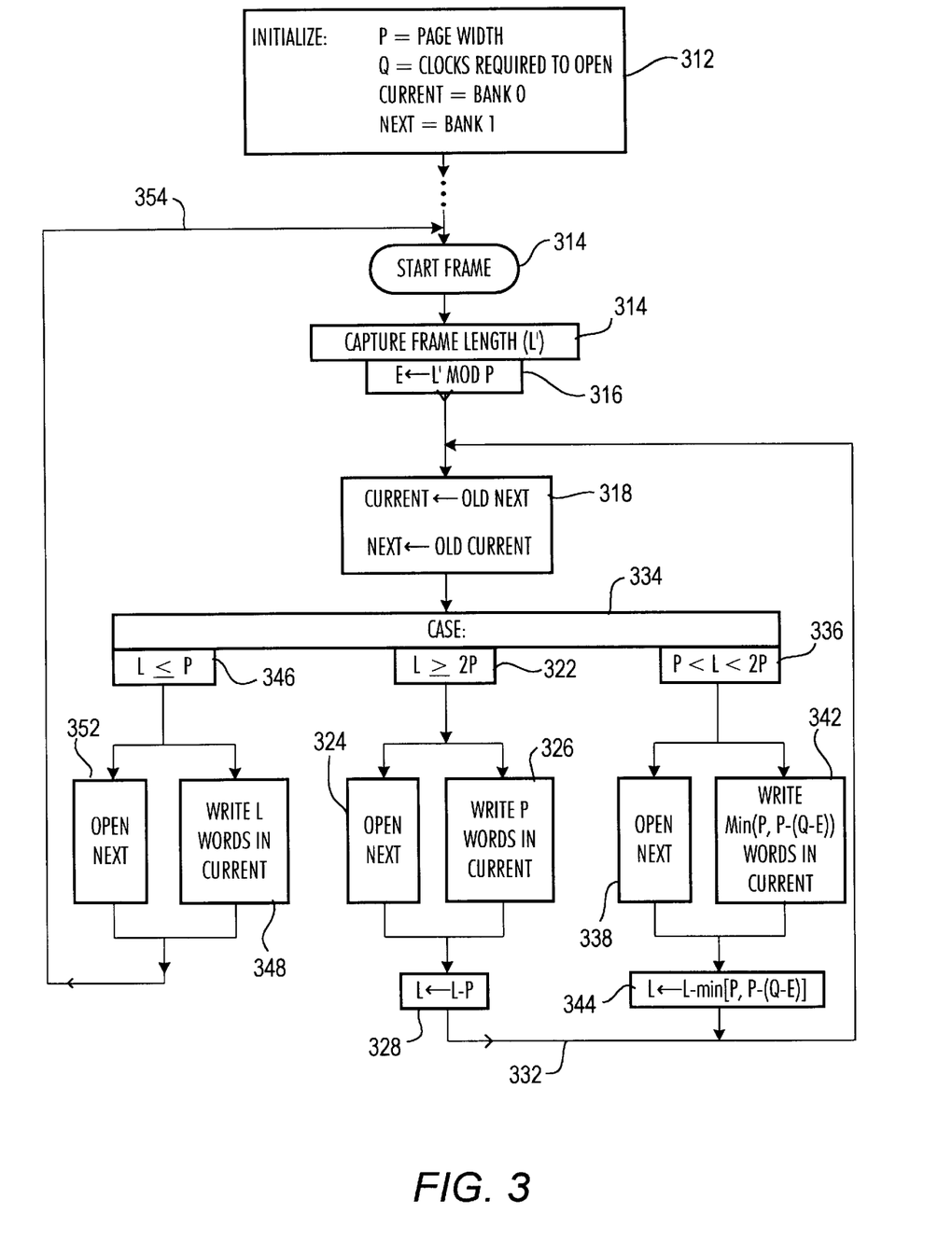
FIG. 3 is a flowchart depicting a process for memory storage according to an embodiment of the present invention.

As illustrated in FIG. 3, according to one embodiment, for any values of P and Q, if P is greater than or equal to Q, a procedure can be performed initiating variables P and Q to, respectively, indicate page width and clock cycles required to open a page and a "current" variable can be used to indicate which bank is currently being written to while a "next" bank can be used to indicate the bank which indicates the next page that will be written to (selected initially to be bank zero and bank one respectively in FIG. 3) 312. At the start of a frame receipt 314, the frame length (or number of words in the frame L') is captured 314. The number of extra words E can be calculated and stored, as L' MOD P 316. The values stored by the "current" and "next" variables are interchanged 318. The manner in which data is stored into a page is dependent on the relative values of L (i.e., the number of words not yet stored) and P. If L≧2P (such that there are at least two pages worth of data not yet stored) 322, the system can simultaneously perform a page-opening procedure 324 (for the next page, in the "next" bank) and will write P words into the open page of the current bank 326. The value of L is decremented by P 328 (to reflect the new number of words of the frame still remaining to be stored). The procedure then loops back 332 to interchange the values of "current" and "next" banks and test the relative values of L and P 334. If P<L<2P 336, the procedure simultaneously opens a page in the "next" bank 338 and writes a number of words in the open page of the current bank which is equal to the difference between the number of extra words in the frame and the value of Q, subtracted from P. For some values of P, Q and E, this could result in a number greater than P. In this situation, no more than P words will be written into the open page. The number of words to be written into the open page can thus be expressed as MIN (P, P–(Q–E)). For example, applying this calculation to the example of FIGS. 1B and 2B, (P=8, Q=2 and E=1) P–(Q–E)) yields 7 and thus 7 words are stored in the penultimate page 216c (as depicted in FIG. 2B). As before, the value of L is decremented by the number of words that were stored and the procedure loops 332. In the case that L≦P, 346 the last page of the frame data is being stored. In this situation, L words are stored in the open page of the "current" bank 348 simultaneously with opening a page in the "next" bank for write access (to permit storing the initial portion of the next frame) and the system loops 354 to begin processing the next frame 314.

Figure 5:
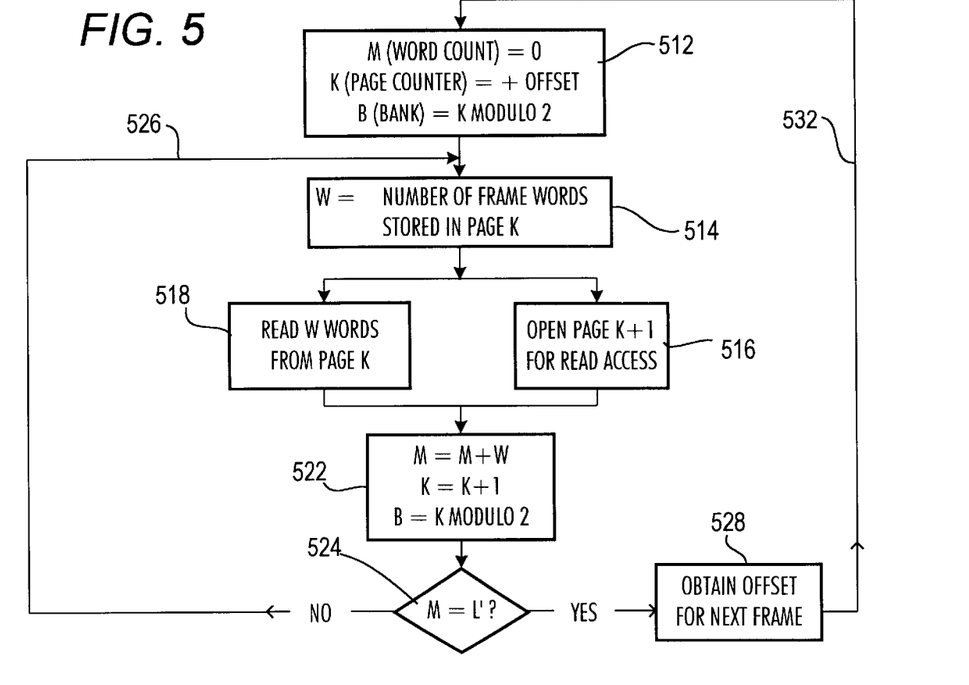
FIG. 5 is a flow chart depicting a process for memory read-out according to an embodiment of the present invention.

Once data has been stored using a procedure as depicted in FIG. 3, it can be read-out in a manner to avoid dead time using a procedure, e.g., as depicted in FIG. 5. In the illustration of FIG. 5, a number of variables or parameters are initiated. Variable M indicates the total word count read-out (initialized to zero). K indicates the current page and is initialized to an offset value equal to the page number of the first page of a frame. B indicates the bank number and for a twobank memory is equal to K MOD 2 512. W is used to store the number of frame words stored in the open page K 514. For example, with reference to FIG. 2B, the value of W when the first or second page 216a, 216b is open would be 8. The value of W when the third page is open 216c would be 7 and the value of W in the fourth page 216d is open would be 2. Substantially simultaneously, the next page, K+1 (presuming frame data is stored in sequential pages) is opened for read access 516 and W words are read from open page number K 518. The value of M is incremented by W, K is incremented by 1 and the bank is determined for the next read 522. If M has not reached the value of L' (i.e., the entire frame has not yet been read-out) 524 the procedure loops 526 to determine the number of frame words in the next page which is in read-out 518 while the following page is opened 516 and so forth. If the word count M has reached the number of words in the frame 524, the offset value for the next frame is obtained 528 and the procedure loops 532 to begin reading out the next frame.

The procedure illustrated in FIG. 3 can be some what simplified for a value of Q which is equal to two. This condition leads to some simplification since there is only one possible non-zero value of E which is less than Q, namely, when E=1.

Figure 4:
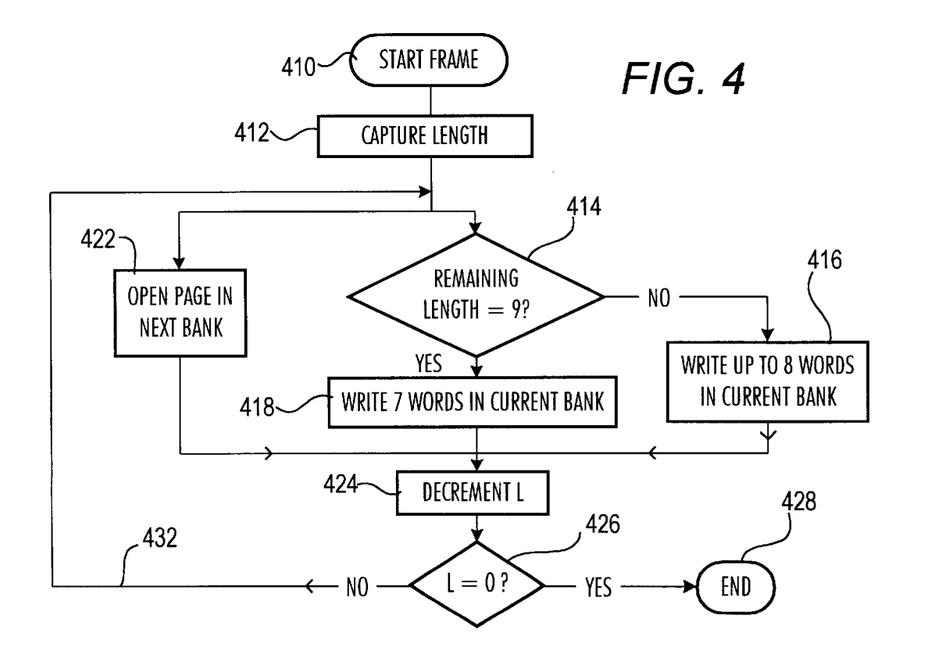
FIG. 4 depicts a process for memory storage according to an embodiment of the present invention.

In the procedure of FIG. 4, at the start of the frame 410, the frame length is captured 412. The example of FIG. 4 is configured to illustrate a situation which P=8 and Q=2. At each stage, it is determined whether the remaining length is equal to 9 414 (i.e., E=1 and P=8. If the remaining length is not equal to 9 (i.e., is 8 or less, or is 10 or greater). The system will write up to 8 words (if available) into the open page of the current bank 416. However, if the remaining length is exactly 9, the system will write 7 words in the current bank 418. In either case 414, 418 or 416, writing is performed substantially simultaneously with opening the next page in the next bank (for write access 422). The remaining length is decremented by the numbers of words that were written 424 and, unless the remaining length is zero 426 (in which case the write procedure for this particular frame is concluded 428) the procedure will loop 432 to once again determine the remaining length 414 and write the appropriate number of words 418 or 416.

In light of the above description, a number of advantages of the present invention can be seen. The present invention provides for more efficient use of DRAM or other memory devices by increasing the effective bandwidth. The present invention can reduce or eliminate the occurrence of dead time, e.g. caused by waiting for a page end bank to be opened. The present invention makes it possible to perform an access (a word-read-out) on substantially every clock cycle.

A number of variations or modifications of the invention can be used. Although embodiments of the present invention were described in connection with two-bank memories, those of skill in the art will understand how to implement some or all features of the present invention in the context of memories having more than two banks, after understanding the present disclosure. Although the embodiments of the present invention and/or problems solved by the present invention were described in the context of FIFO memories used in network or telecommunications equipment, some or all features of the present invention can be used in any system or apparatus which employ or could employ a multi-bank memory. Although it is contemplated that the present invention may be implemented using multiple bank dynamic random access memories (DRAMs) there is no theoretical reason why some or all aspects of the present invention could not be used in other types of memory which were organized in multiple banks and require an amount of time to prepare a page (or other portion) of memory before read-out could begin. Although it is contemplated that a memory control unit (MCU) or similar device can be used for controlling the timing of data read-outs from various pages (so as to increase bandwidth as described herein) it is possible (though not necessarily advisable) to use other devices or systems for determining when to begin read-out operations from the next memory page (or other unit) including storing (e.g., in a specialized memory) pointers which indicate which pages are not full, and/or analyzing the content of data as it is read-out to recognize markers or other indicators designating the end of a frame (or other block). Although examples have been provided in which words were "borrowed" from a previous page in order to assure that a final page had an increased number of words, it is also possible to configure a system such that some or all words needed for increasing the number of words in a final page are borrowed from pages other than the penultimate page and, when more than one word is borrowed, words may be borrowed from multiple different pages of a frame. Although embodiments of the present invention were described in the context of systems in which a word can be read out in one clock cycle, and in which same clock length governing word read-out also governs page-opening, those of skill in the art will understand how to implement embodiments of the present invention in systems where the ratio of the time for read-out of a word to the length of clock cycles which govern page-opening, is other than 1.0. Although, examples depicted in FIGS. 2A and 2B illustrate pages which are sequentially read-out are also sequentially-stored, it is possible to implement the present invention in situations in which memory pages which are not physically sequential to one another are used to store pages which will be sequentially-read-out (in order to output a frame in the proper sequence). Although FIG. 2B generally illustrates that the unused words from the penultimate page are left blank (data is not stored therein) it is possible to use the otherwise unused word 218 from the penultimate page 216c for storing a word of data. Similarly, any words of the last page 216d of a frame 222a through 222f which are unused for storing frame data, could, at least theoretically be used for storing other data. It would be possible to store frame data in all words of the penultimate page 216c, in the same manner illustrated and described in FIG. 2A, but to repeat one (or more) words from the penultimate page 216 when storing data into the last page 216d. Although procedures have been described and illustrated depicting certain embodiments of the present invention, it is possible to implement the invention using different or modified procedures including procedures having more or fewer steps or in which steps are performed in an order different than that depicted.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease andor reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for storing into an electronic memory a multiple-data-word frame said frame defining a number of data words in said frame, said electronic memory having a plurality of pages, said pages having a number of words in each page, the method comprising:
   determining a number of extra words in said frame as the number of words in a frame modulo the number of words in a page from the plurality of pages;
   storing the words of said frame into the plurality of pages of the electronic memory wherein at least two of said plurality of pages stores a number of words which is less than a page width of the electronic memory.

2. A method as claimed in claim 1 wherein read-out of each word requires at least one clock cycle and wherein opening of a page requires a number of clock cycles greater than one; and
   wherein said step of storing said words is performed such that all of said plurality of pages stores a number of words from said frame which is at least equal to said number of clock cycles required for opening a page.

3. A method as claimed in claim 1 further comprising:
   sequentially reading out said plurality of pages from said electronic memory wherein reading out of at least one of said plurality of pages is initiated immediately after reading out fewer than P words from a previously read-out page.

4. A method as claimed in claim 3 wherein the number of pages, in said plurality of pages, used for storing fewer than P words of said frame is greater than 2.

5. A method as claimed in claim 1 wherein said electronic memory is a two-bank electronic memory.

6. A method as claimed in claim 1 wherein said electronic memory is a dynamic random access memory.

7. Apparatus for storing into an electronic memory a multiple-data-word frame said frame defining a number of data words in said frame, said electronic memory having a plurality of pages, said pages having a number of words in each page, the method comprising:
   means for determining a number of extra words in said frame as the number of words in the frame modulo the number of words in a page from the plurality of pages;
   means for storing the words of said frame into the plurality of pages of the electronic memory wherein at least two of said plurality of pages stores a number of words which is less than a page width of the memory.

8. Apparatus as claimed in claim 7 wherein said means for determining includes a computer.

9. Apparatus as claimed in claim 7 wherein said means for storing includes a memory management unit coupled to a dynamic random access memory.

10. Apparatus as claimed in claim 7 wherein read-out of each word requires at least one clock cycle and wherein opening of a page requires a number of clock cycles greater than one; and
   wherein said means for storing said words includes means for storing such that all of said plurality of pages stores a number of words from said frame which is at least equal to said number of clock cycles required for opening a page.

11. Apparatus as claimed in claim 7 further comprising means for reading out at least one of said plurality of pages immediately after reading out fewer than P words from a previously read-out page.

12. Apparatus as claimed in claim 11 wherein the number of pages, in said plurality of pages, used for storing fewer than P words of said frame is greater than 2.

13. Apparatus as claimed in claim 7 wherein said electronic memory is a two-bank electronic memory.

14. Apparatus as claimed in claim 7 wherein said electronic memory is a dynamic random access memory.

15. Apparatus for storing into an electronic memory a multiple-data-word frame said frame defining a number of data words in said frame, said electronic memory having a plurality of pages, said pages having a number of words in each page, the method comprising:
   a computer configured to receive the frame and calculate a number of extra words in said frame as the number of words in the frame modulo the number of words in a page from the plurality of pages;
   a memory management unit in said computer, coupled to said electronic memory, said memory management unit controlled to store the words of said frame into the plurality of pages of the electronic memory wherein at least two of said plurality of pages stores a number of words which is less than a page width of the electronic memory.

16. Apparatus as claimed in claim 15 wherein read-out of each word requires at least one clock cycle and wherein opening of a page requires a number of clock cycles greater than one; and
   wherein said memory management unit is controlled such that all of said plurality of pages stores a number of words from said frame which is at least equal to said number of clock cycles required for opening a page.

17. Apparatus as claimed in claim 15 wherein said memory management unit is controlled to read out at least one of said plurality of pages immediately after reading out fewer than P words from a previously read-out page.

18. Apparatus as claimed in claim 17 wherein the number of pages, in said plurality of pages, used for storing fewer than P words of said frame is greater than 2.

19. Apparatus as claimed in claim 15 wherein said electronic memory is a two-bank memory.

* * * * *

UNITED STATES PATENT AND TRADEMARK OFFICE
CERTIFICATE OF CORRECTION

PATENT NO.    : 6,587,936 B1
DATED         : July 1, 2003
INVENTOR(S)   : Rivers et al.

It is certified that error appears in the above-identified patent and that said Letters Patent is hereby corrected as shown below:

<u>Column 9,</u>
Lines 14 and 52, replace "read-out" with -- readout --;

<u>Column 10,</u>
Line 33, replace "read-out" with -- readout --.

Signed and Sealed this

Thirtieth Day of September, 2003

JAMES E. ROGAN
*Director of the United States Patent and Trademark Office*